United States Patent
Weinberg et al.

(10) Patent No.: US 11,959,989 B2
(45) Date of Patent: Apr. 16, 2024

(54) APPARATUS AND METHOD FOR MAGNETIC RESONANCE IMAGING WITH ELECTROPERMANENT MAGNETS

(71) Applicant: Weinberg Medical Physics Inc, North Bethesda, MD (US)

(72) Inventors: Irving Weinberg, North Bethesda, MD (US); Oleg Udalov, North Potomac, MD (US)

(73) Assignee: WEINBERG MEDICAL PHYSICS INC

( * ) Notice: Subject to any disclaimer, the term of this patent is extended or adjusted under 35 U.S.C. 154(b) by 0 days.

(21) Appl. No.: 17/841,614

(22) Filed: Jun. 15, 2022

(65) Prior Publication Data

US 2022/0397625 A1 Dec. 15, 2022

Related U.S. Application Data

(60) Provisional application No. 63/210,702, filed on Jun. 15, 2021.

(51) Int. Cl.
*G01R 33/561* (2006.01)
*G01R 33/34* (2006.01)
*G01R 33/381* (2006.01)

(52) U.S. Cl.
CPC ......... *G01R 33/5615* (2013.01); *G01R 33/34* (2013.01); *G01R 33/381* (2013.01); *G01R 33/5616* (2013.01)

(58) Field of Classification Search
CPC .................................................. G01R 33/381
See application file for complete search history.

(56) References Cited

U.S. PATENT DOCUMENTS

| | | | | |
|---|---|---|---|---|
| 5,363,041 A * | 11/1994 | Sezginer | ............... | G01V 3/32 324/303 |
| 5,572,132 A * | 11/1996 | Pulyer | ............... | G01R 33/3808 324/318 |
| 6,133,753 A * | 10/2000 | Thomson | ............. | G11C 7/1051 326/60 |
| 6,166,543 A * | 12/2000 | Sezginer | ............. | G01N 24/081 324/303 |
| 2006/0255799 A1* | 11/2006 | Reiderman | .......... | G01R 33/383 324/303 |
| 2019/0391217 A1* | 12/2019 | Weinberg | ............. | G01R 33/385 |
| 2020/0246629 A1* | 8/2020 | Weinberg | ............. | G01R 33/383 |

OTHER PUBLICATIONS

Ropp et al., Electropermanent magnets for variable-field NMR, Journal of Mangetic Resonance 303 (2019) 82-90 (Year: 2019).*
Cooley et al, Two-dimensional imaging in a lightweight portable MRI scanner without gradient, Magnetic Resonance in Med 73:872-883 (2015) (Year: 2014).*
Fessler, Model-Based Image Reconstruction for MRI, IEEE Signal Processing Magazine [81] Jul. 2010 (Year: 2010).*

* cited by examiner

*Primary Examiner* — Steven L Yeninas
(74) *Attorney, Agent, or Firm* — Barnes & Thornburg LLP

(57) ABSTRACT

Apparatuses and methods for MRI take advantage of properties of electropermanent magnet module arrays to change the magnetic state of their magnetizable material during a spin echo.

12 Claims, 11 Drawing Sheets

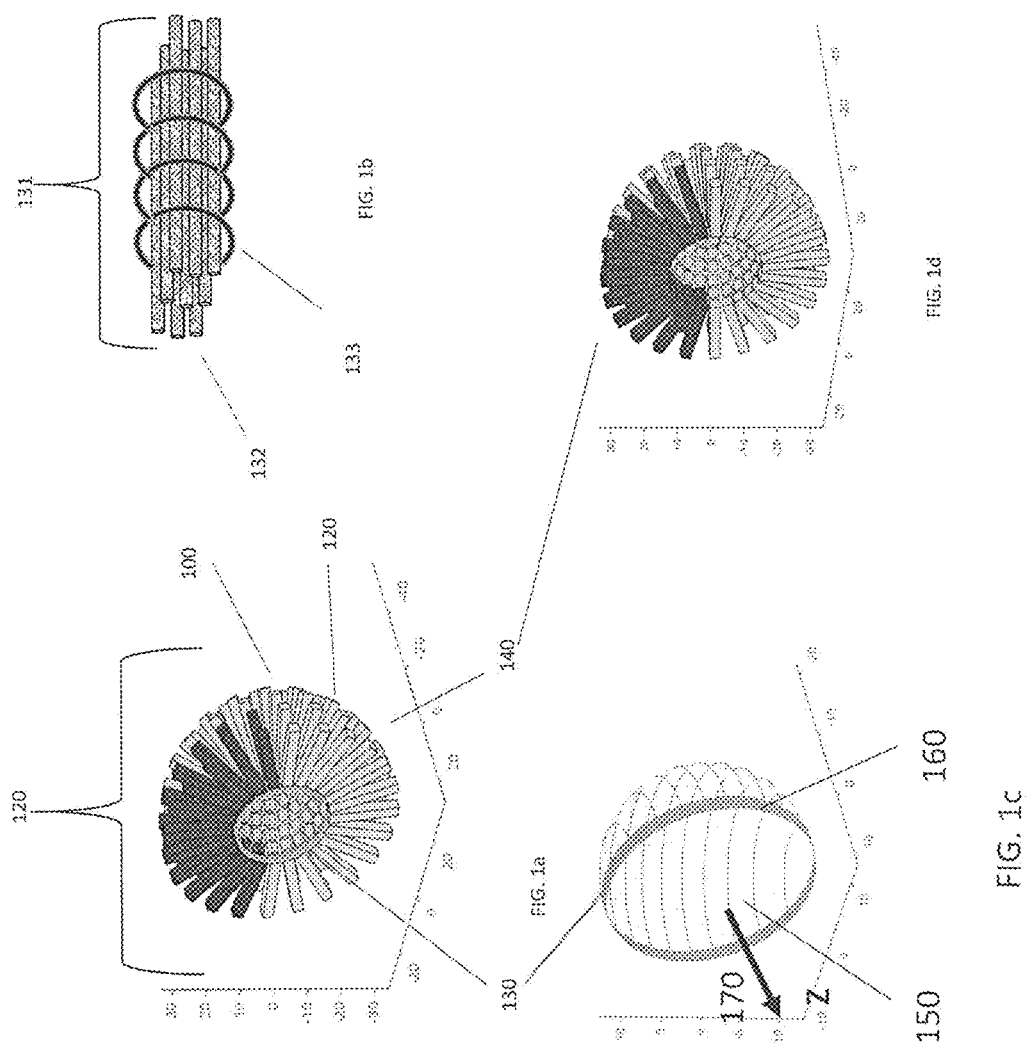

US 11,959,989 B2

APPARATUS AND METHOD FOR MAGNETIC RESONANCE IMAGING WITH ELECTROPERMANENT MAGNETS

CROSS REFERENCE AND PRIORITY CLAIM

This application claims priority to U.S. Provisional Patent Application Ser. No. 63/210,702, entitled "APPARATUS AND METHOD FOR MAGNETIC RESONANCE IMAGING WITH ELECTROPERMANENT MAGNETS" filed 15 Jun. 2021, the entirety of which is incorporated by reference.

FIELD

Disclosed embodiments are directed to an apparatus and method for magnetic resonance imaging (MRI). The invention may be used in medical and veterinary applications. In particular, disclosed embodiments include an apparatus that uses electropermanent magnet modules (EPMM) to perform magnetic resonance imaging, and several methods of generating images using a magnetic resonance imaging (MRI) system with electropermanent magnet modules.

Conventional MRI uses superconducting or permanent magnets to create a static (uniform) magnetic field, with additional gradient coils that create linear magnetic gradient fields, which vary in time. Those gradient fields cause objects in the field of view at different locations to resonate at different frequencies (i.e., providing spatial encoding). The Fourier transform method is generally used to recover the spatial location of objects from the MRI signal.

Conventional MRI systems employ radiofrequency (RF) antennas to transmit RF energy into a subject in order to create imbalances in net spin magnetization. The present disclosure describes a method of constructing MRI systems which exploit the abilities of EPMM arrays to eliminate the need for transmitting RF energy into a subject.

SUMMARY

Apparatuses and methods for MRI are described which take advantage of properties of EPMM arrays. In disclosed embodiments, one or more of the EPMMs change the magnetic state of their magnetizable material during a spin echo. A method is disclosed for collecting MR images without applying RF radiation, using the properties of the EPMM arrays. Reconstruction of the image is implemented by creating a system matrix that describes the time evolution of spins of objects in the field-of-view. The system matrix may then be used to recover the spatial distribution of the objects, for example by employing a conjugated gradient method with regularization.

In some embodiments, an apparatus for producing magnetic resonance images of an object of interest that comprises one or more arrays of electropermanent magnets in the vicinity of the object of interest, one or more sensors of electromagnetic radiation, and circuitry required to supply power to and to control the one or more arrays and sensors to change magnetic configurations of the one or more arrays.

In some embodiments, a method for producing magnetic resonance images comprises providing one or more arrays of electropermanent magnets in the vicinity of the object of interest, one or more sensors of electromagnetic radiation, and circuitry required to supply power to and to control the one or more arrays and sensors, producing and changing a magnetic configuration of the one or more arrays to produce echoes, and reconstructing an image based on the echoes.

BRIEF DESCRIPTION OF FIGURES

Aspects and features of the invention are described in connection with various figures, in which:

FIG. 1a illustrates an example of an assembled configuration of electro-permanent magnet modules (EPMMs) and radio frequency (RF) coils in the top row;

FIG. 1b is an example of an EPMM, including a core composed of smaller magnetizable rods, surrounded by a wire coil;

FIG. 1c separately shows the RF coils of FIG. 1a;

FIG. 1d shows the EPMM array of FIG. 1a without the RF coils;

DETAILED DESCRIPTION

The present invention will now be described in connection with one or more embodiments. It is intended for the embodiments to be representative of the invention and not limiting of the scope of the invention. The invention is intended to encompass equivalents and variations, as should be appreciated by those skilled in the art.

Figure 1E:
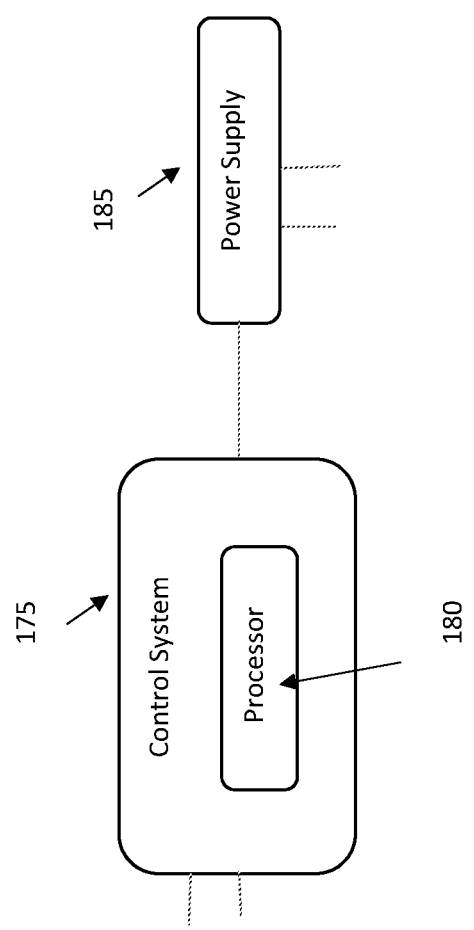
FIG. 1e is a block diagram of a control system and power source according to the disclosed embodiments.

As seen FIGS. 1 a-1 d, EPMMs 131 are illustrated in different shades of gray, representing different magnetization states. Each EPMM may include ferromagnetic material as well as wires or other electrical conductors, sensors, electrical and electronic components, and power storage devices (for example capacitors). RF coils may be used to transmit and/or receive RF signals from objects (such as animal or human body parts) near or in array 120. For the purpose of this disclosure, we will refer to these objects as the "body". For clarity, the bottom left FIG. 1c separately shows RF coils 130, which may include a transmitting coil set 150 and a receiving coil set 160. The bottom right of FIG. 1d shows the EPMM array 140 without the RF coils. It is understood that although the RF coils are shown separately from the EPMM array, in another embodiment there may be RF coils within one or more EPMMs. FIG. 1B is an example of an EPMM 131, including a core composed of smaller magnetizable rods 132, surrounded by a wire coil 133. Current to coil 133 may be provided by a capacitor with switching, communication, and control circuitry as part of, for example, a control system 175 including a computer, or processor 180 and power supply 185 as illustrated in FIG. 1 e. EPMM may be cooled with fluid channels, tubes, or fans (not shown). For convenience of explanation, the z-direction 170 is considered to be perpendicular to the face of the dome.

In FIG. 1, electropermanent magnets modules (EPMMs) 100 and 110 are shown in different shades of black to represent different magnetization states. Each EPMM includes one or more structures made of magnetizable material (for example rods of AlNiCo), with one or more conducting structures (for example, a wire coil) surrounding or otherwise placed in proximity to the magnetizable material. An example of an EPMM is shown as 131, including a core containing at least one magnetizable rod 132, with the core surrounded by coil 133. The EPMM may also include one or more circuits to apply and control current pulses through the conducting structure(s). Each EPMM may be magnetized independently of the others. Each EPMM may communicate with a host device controlling the entire apparatus. In FIG. 1, the apparatus forms a dome in which, or near which, a body part of a human or animal subject or another object of interest may be placed. For the purposes of this disclosure, the space containing the body part or object of interest is described as the region of interest or volume of interest. It is understood that the dome array shown in FIG. 1 is only one example of many EPMM array configurations that are possible in this invention. For the purposes of this invention disclosure, the apparatus consists of one or more EPMM arrays in the vicinity of an object or body part of interest, the vicinity being defined as less than 10 meters from any part of the object or body part of interest. In a conventional MRI system, a static field is produced by a permanent magnet or by one or more superconducting "static" coils. In a conventional MRI system, separate "gradient" coils are used to generate magnetic fields that vary in space and time. The disclosed EPMMs effectively can replace both the static and gradient coils.

A set of RF coils is shown as 130 in FIG. 1. The coil set may be placed within the bore of the EPMM array and around or near the studied object. The coil set may consist of two coils (transmitting 150 and receiving 160) as shown. In an embodiment, the RF receiving coil 160, which detects RF signals from the body part of interest, may be replaced in part or completely by one or more RF-sensitive magnetometers. An example of such a magnetometer was provided in the publication by Ingo Hilschenz et al in the Journal of Magnetic Resonance in 2016 (DOI: 10.1016/j.jmr.2016.11.006). In some embodiments, a single coil may serve to both RF transmit and receive RF energy. In some embodiments, magnetic spins in the body part of interest may be aligned by creating an appropriate magnetic field with the EPMM array and then changing the magnetic field for RF acquisition, so that an RF transmission coil is not necessary. The meaning of "appropriate magnetic field" is that the net magnetization of the spins can be aligned by the EPMM so that the magnetization is perpendicular to the plane in which subsequent rotation of the spins occur. This is further explained below, corresponding to FIG. 6.

Figure 2:
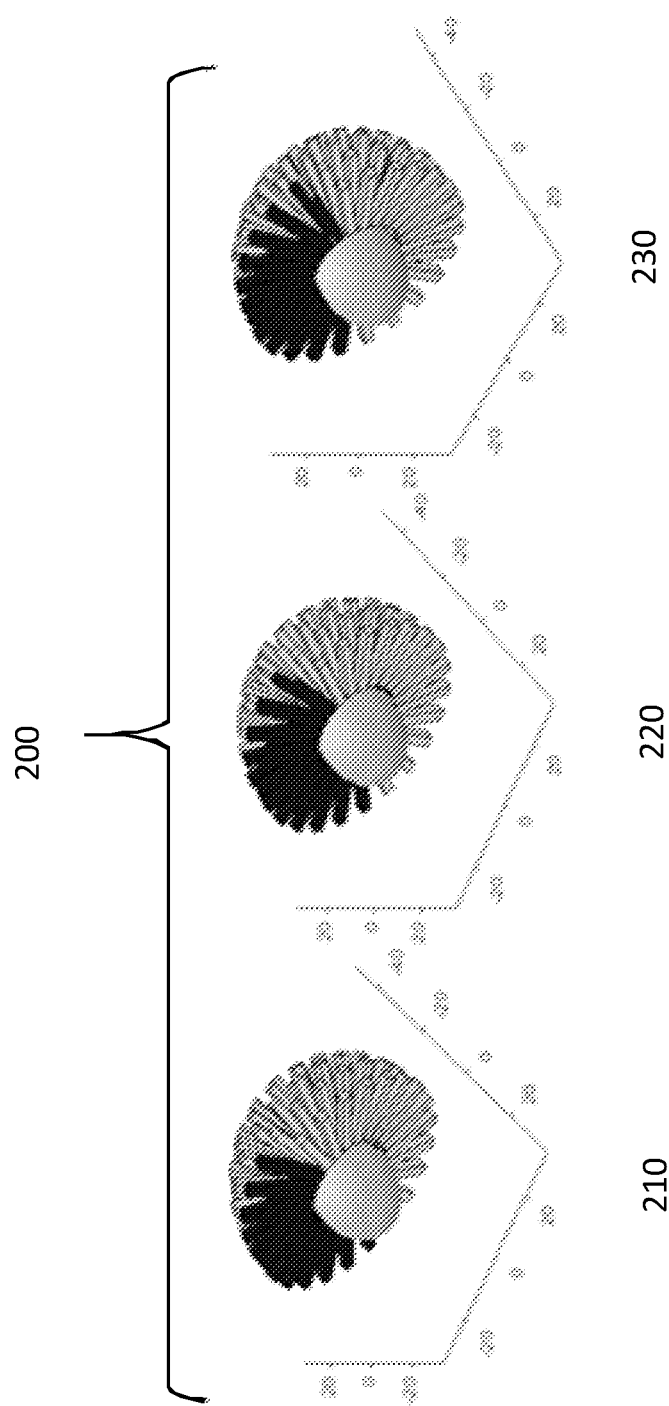
FIG. 2 illustrates a set of EPMM magnetizations.

FIG. 2 illustrates a set 200 of EPMM magnetizations 210, 220, 230. In each configuration several magnets are in a different shade than others indicating that their magnetizations differ from other EPMMs in the array. A feature of disclosed embodiments is that the EPMM array can be used to create many configurations of magnetic fields in the volume-of-interest, including highly non-linear fields. Examples of such EPMM configurations are shown in FIG. 2. Another feature of the disclosed embodiments is that the magnetic configurations may be rapidly changed by selecting various sets of EPMMs to be energized and magnetized in various directions.

Figure 3:
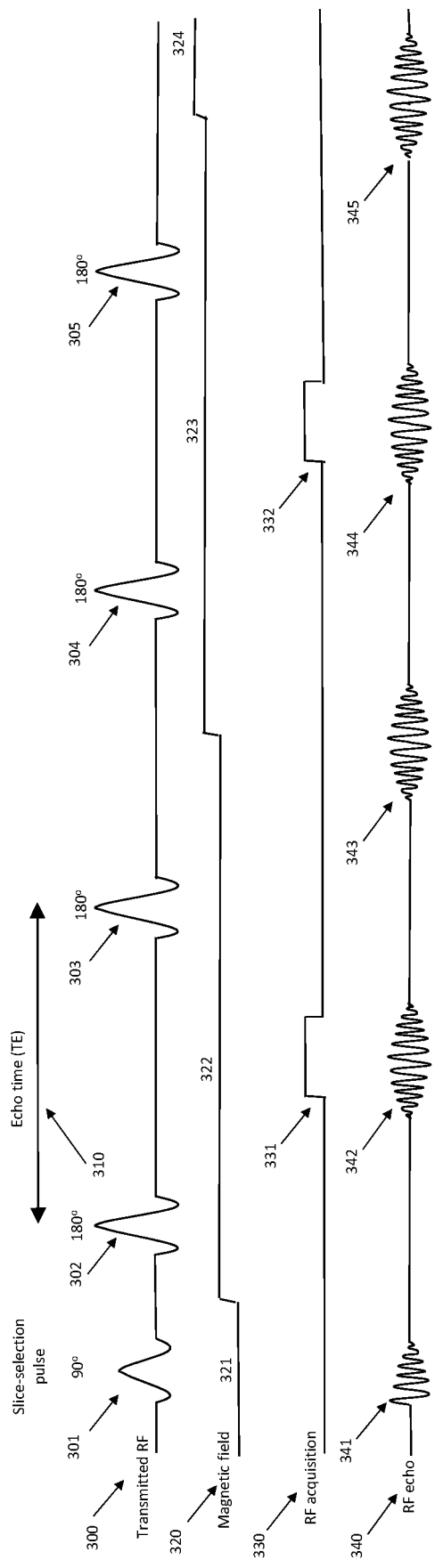
FIG. 3 shows an embodiment of section of a timed pulse sequence for imaging using an MRI device as in FIG. 1 and EPMM configurations as in FIG. 2.

FIG. 3 shows an embodiment of section of a timed pulse sequence for imaging using an MRI device as in FIG. 1 and EPMM configurations as in FIG. 2. Since the EPMM array creates all the magnetic fields in FIG. 3, there is no constant static (B0) field assumed, as would be present in a conventional MRI pulse sequence diagram. For ease of reference, the various lines of action in the pulse sequence are labeled both with numbers and words. Row 300 represents the radiofrequency (RF) energy transmitted by an RF antenna (e.g., 130 of FIG. 1) into a body. Row 320 represents the magnetic field in a portion of the body created by the EPMM array (e.g., 120 of FIG. 1). In a conventional MRI, a static field B0 is applied by superconducting or resisting magnets and is not generally shown in a pulse sequence diagram. Row 330 represents the time that an RF receiver is open to signals from the body. Row 340 represents the RF signals emitted by the body.

The often non-linear nature of the magnetic configurations that can be generated by the apparatus represents a challenge to form an image using conventional MRI reconstruction principles (which generally use linear gradient configurations). An example of a "spin-echo" pulse sequence generated by the apparatus is shown in FIG. 3. FIG. 3 graphically demonstrates the sequence of gradients, radio frequency pulses and acquisition windows. The transmitted RF pulses are shown in the upper row of FIG. 3 300. The magnetic field configuration sequence is shown in the second row from the top, on trace 320. The RF acquisition window (representing the time that signals are recorded by the RF acquisition coil or magnetometer) are sown in the third row. The RF signals generated by spins in the volume of interest are shown in the bottom row 340).

The pulse sequence diagrammed in FIG. 3 (and described by flowchart FIG. 4) resembles a classic spin-echo sequence in which spin refocusing is induced by RF pulses. Beginning after the first echo, the sequence can be considered as consisting of repeating intervals, each subsequent interval of which corresponds to a single magnetic configuration and each of which has a duration 2*TE. It is understood that the pulse sequence of FIG. 3 may be preceded by a pre-magnetization pulse applied by the EPMM array in order to increase the net magnetization.

Going into more detail in a time-dependent fashion, RF pulse 301 represents a 90-degree region selection pulse transmitted into the body, while a magnetic field 321 which is relatively uniform in an x-y plane in the volume of interest, is applied by the EPMM array. If field 321 is relatively uniform in the x-y plane, then the region of excited spins may be a slice defined by a particular z-value in the body. Alternatively, the region may not be slice shaped. For ease of explanation, the region may be referred to as the slice. Soon after the 90-degree region selection pulse is applied (e.g., around the x-axis), a free-induction decay (FID) signal 341 is emitted by the body. Although acquisition is not illustrated in FIG. 3, the FID might be acquired in some embodiments. The EPMM array then changes the magnetic field to a different configuration 322, to encode spatial information in the protons of the slice. The configuration 322 of the magnetic field might be created by the EPMM configuration 210 in FIG. 2, for example.

A 180-degree RF pulse 302 (e.g., around a y-axis) is then applied to the body. The echo time of the pulse sequence 310 is two times the length of time between the 90-degree pulse and the 180-degree pulse, and is also the length of time between successive 180-degree pulses (303, 304, 305, etc.).

At half the echo-time after the first 180-degree pulse 302 is applied, an echo signal 342 is emitted by the slice. The RF acquisition channel 331 is enabled and the echo signal 342 is thereby recorded for later analysis.

Another 180-degree RF pulse 303 is applied after an echo-time, forming another echo 343. In the middle of this echo, the EPMM array changes the magnetic field in the body to another configuration 323. The EPMM configuration of the magnetic field –323 is shown as 220 in FIG. 2. The reason for changing the magnetic field configuration at this time is that the phase of the spinning protons is approximately zero. After another half-echo-time, another 180-degree RF pulse 304 is applied after an echo-time, forming another echo 344, which is recorded for acquisition 332. The sequence continues (i.e., RF 305, configuration 324, echo 345) until a sufficient amount of data has been recorded to reconstruct an image. The EPMM configuration of the magnetic field 324 is shown as 230 in FIG. 2.

The spin dynamics of the net magnetization are described for the pulse sequence of FIG. 3: An EPMM configuration 321 is selected to achieve a relatively uniform magnetic field (with respect to the x-y plane) in the desired z-slice. The term "relatively uniform" is used to imply that the magnitude is within a fraction of a millitesla within the desired z-slice, with the fraction depending on the bandwidth of the RF pulse applied. A first RF pulse 301 rotates the net magnetization by (approximately) 90 degrees around the y-axis. After pulse 301 ends, the first imaging configuration 322 is applied. The magnetic field of this configuration is non-uniform in the x-y plane. After a time interval TE/2, RF pulse 303 rotates proton spins by (approximately) 180 degrees around the z-axis. RF signal acquisition is enabled 331. The size of the acquisition window $T_{acq}$ may be selected on the basis of the desired signal-to-noise ratio. The acquisition window starts (TE–$T_{acq}$)/2 after the 180-degrees pulse 302. After the acquisition ends, the system waits for another (TE–$T_{acq}$)/2 time interval before the next RF 180-degree pulse 304 is applied. All subsequent TE intervals have the same structure. The EPMM configuration is constant throughout the TE interval, changing only in the middle of every other echo when the spin echo is maximized, since that is when most of the spins are at the same phase.

Figure 4:
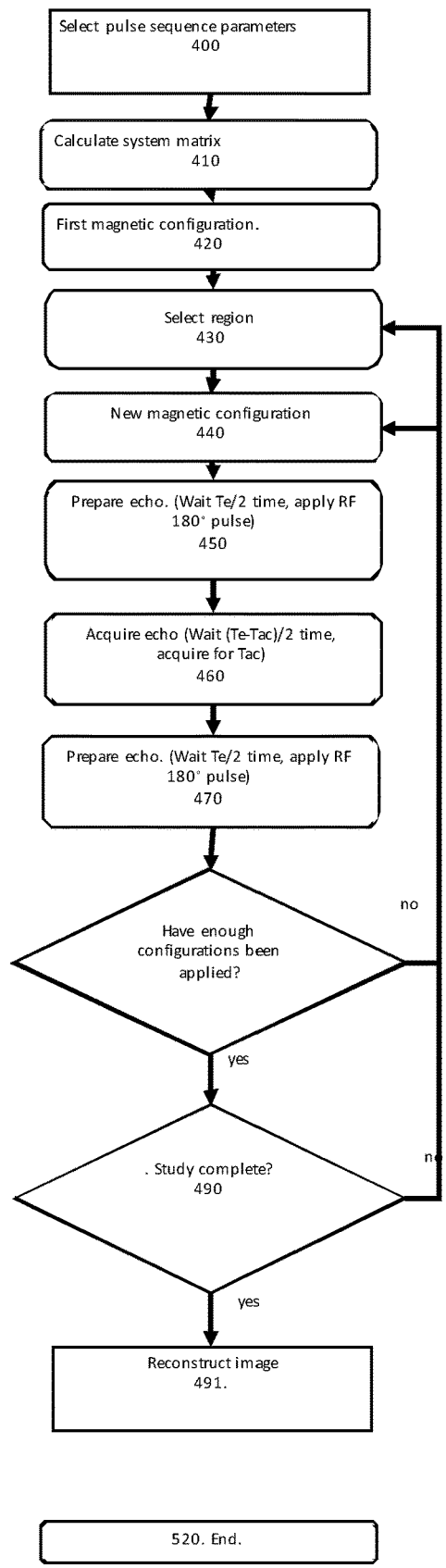
FIG. 4 shows a flowchart for the image acquisition process according to the disclosed embodiments.

FIG. 4 shows a flowchart for the image acquisition process, which corresponds to the pulse sequence shown graphically in FIG. 3. In 400, pulse sequence parameters are determined by a computer, based on input from a user. One of the parameters is the number of configurations to be applied (the number defined as Nconfig). At 410, a system matrix is calculated by the computer, based on the pulse sequence parameters. At 420, a first magnetic configuration is implemented (by appropriately firing various EPMMs), the configuration corresponding to, for example, 321 in FIG. 3. RF energy is applied (typically a 90-degree pulse) to select a region of interest in the sample to be imaged 430, corresponding to, for example, 301 in FIG. 3. Although the term 90-degree pulse is used, it is understood that a different (i.e., smaller) tip angle may be useful, for example to do rapid imaging. Another magnetic configuration is implemented 440 (by appropriately firing various EPMMs), the configuration corresponding, for example, to 322 in FIG. 3. Another RF pulse (typically a 180-degree pulse) is applied to prepare an echo 450, corresponding to, for example, 302 in FIG. 3. Information from the echo is acquired for a time Tacq 460, corresponding to, for example, 331 in FIG. 3. Another RF pulse (typically a 180-degree pulse) is applied to prepare an echo 470, corresponding to, for example, 303 in FIG. 3. A decision point 480 may be made dynamically (i.e., during the sequence) or may be made during the selection of pulse sequence parameters 400 to determine the pulse sequence. A computer examines whether the number of configurations is sufficient to form an image of acceptable quality 480, and if the number of configurations performed is less than the number prescribed for each 180-degree pulse (Nconfig–180), then operations 440-470 are repeated. An important aspect of the invention is that many of the configurations (e.g., 322, 323) are changed in the middle of echoes. To increase the effective signal of the measurements, repetitions of the pulse sequences may be prescribed 490, where the computer determines whether the number of 90-degree pulses and subsequent 180-degree pulses is sufficient to reconstruct an image of the desired quality. If the number is insufficient (for example, less than the prescribed Nrep), then operations 420 to 480 may be repeated. When sufficient numbers of configurations and acquisitions have been carried out, the data can be reconstructed 491, as described below and in FIG. 5.

Many gradient configurations may be used within a single echo train (i.e., after a single 90-degree pulse) in the method of FIG. 4. The total number of configurations desired for image acquisition may be selected by the computer using parameters defined by a user (for example, field-of-view size). As a rough guide, the number of configurations $N_{config\_180}$ to be used during a single echo train will be defined by the characteristic decay time T2 of objects in the volume of interest and the echo spacing TE (for example, 310 in FIG. 2), with $N_{config\_180}$ approximately T2/(2*TE). To increase the aggregate signals contributing to the eventual reconstructed image of the object, $N_{rep}$ repetitions of the basic pulse sequence may be applied.

Figure 5:
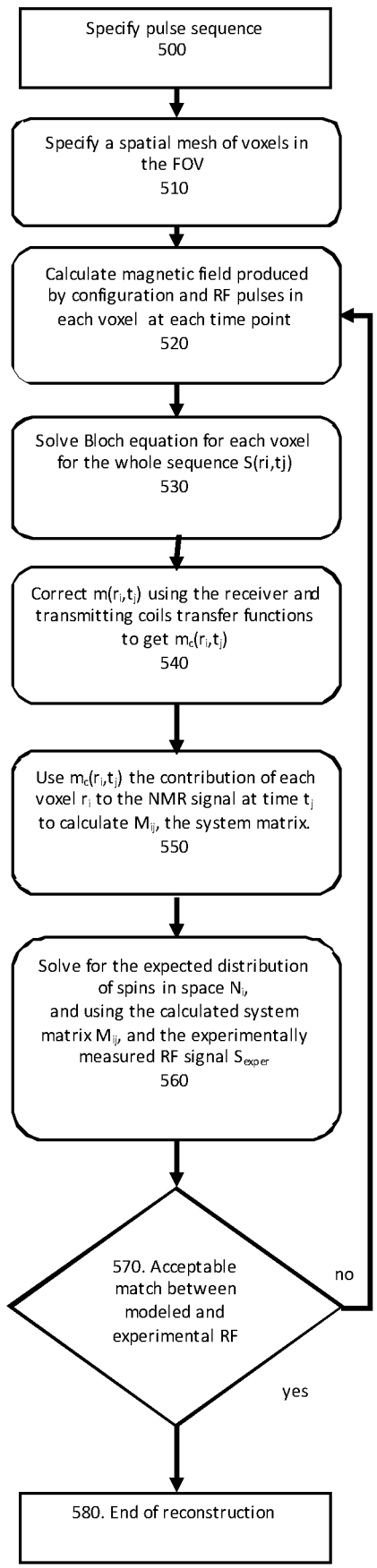
FIG. 5 shows a flow chart for performing reconstruction according to the disclosed embodiments.

The image reconstruction process (which is described by operation 491 in FIG. 4) is shown in more detail with the flow chart of FIG. 5. To recover the image the system matrix Mij is calculated in steps 510-550. In conventional MRI, with linear gradients and homogeneous constant static field, the system matrix is equivalent to the Fourier transform. In the present embodiments, the magnetic gradients are non-linear and switched mid-echo and the field is inhomogeneous during RF pulses. Therefore, the system matrix is obtained using a full spin dynamic simulation. The system matrix can be calculated prior to the imaging based on the chosen EPMM configurations, RF pulse sequence and other parameters, or may be calculated after the RF acquisitions have been collected. The reconstruction is similar to the one described by C. Z. Cooley et al in the article in the journal Magnetic Resonance in Medicine (DOI: 10.1002/mrm.25147), with the novel exception that full spin dynamics are used to calculate the system matrix and Tikhonov regularization may be added.

At 500, the pulse sequence is specified and modeled in software. The pulse sequence includes information about timing and magnitudes of magnetic configurations, RF pulses, etc., as for example shown in FIGS. 3 and 4. At 510, the region of interest is specified and modeled in software as a mesh of locations in space ($r_i$). Thehe magnetic fields produced by the pulse sequence at each location in space are calculated 520. The Bloch equation is solved for the spins in each location in space, as a result of the magnetic fields applied in the pulse sequence 530. The behavior of the spins may be described by the expression $m(r_i,t_j)$, where $r_i$ are the locations of the spins in space, and $t_j$ are acquisition times as for example shown in FIG. 3. The RF signal received during acquisition times may be corrected by receiver transfer functions, and the RF emitted during RF transmission pulses may be corrected by transmitter transfer functions 540. The corrected expression is denoted as $m_c(r_i,t_j)$, which represents the contribution from each voxel $r_i$ at time $t_j$ to the signal detected by the RF acquisition coil. At 550, $m_c(r_i,t_j)$ is used to fill the system matrix $M_{ij}$. An equation $M_{ij}*N(r_i)=S_{exper}(t_j)$ is solved to give the expected distribution of spins $N(r_i)$, given the experimentally measured RF signal $S_{exper}(t_j)$ 560. The equation may be solved using Tikhonov regularization and/or conjugated gradients, described in detail below. Optionally a computer may compare the experimental RF acquisition measurement to the predicted RF signal 570 (i.e., the RF signal that would have been generated by the expected distribution of spins and the calculated system matrix), and may iterate to change the expected distribution of spins and/or the calculated system matrix to minimize the difference between the experimental RF acquisition measurement to the predicted RF signal. If the expected distribution $N(r_i)$ is acceptable, this distribution is displayed as the image to the user 580. It is understood that although the description is provided for spin density, a similar reconstruction process would apply to imaging of other properties of tissues, for example, diffusion.

Operations 520-570 may be performed as follows. To calculate the system matrix $m_{ij}$, the system is split in small voxels in which magnetization is considered uniform 520. Each voxel is subject to action of local magnetic field defined by the current field configuration. During the configuration switching and RF pulses the magnetic field experienced in each voxel varies in time. Then, 530 the computer solves the Bloch equation for each small voxel independently, taking into account all time-dependent magnetic fields acting on this voxel, yielding a function $m(r_i,t_j)$. Correction factors taking into account the circuits effects acquisition windows may be applied to the model, as in operations 540 and 550, in order to form the system matrix $M_{ij}$ that denotes the contribution of spins at each location point $r_i$ at time $t_j$ to the measured voltage. The RF signal acquired by the apparatus is the voltage induced in the receiving coil 160 by time varying magnetic field produced by all voxels. The voltage actually measured in the receiving coil due to all spins at time $t_j$ is denoted as function $S_{exper}(t_j)$. The equation relating NMR signal to proton density is given by the sum in space (i) of the product of $M_{ij}$ and $n_i$, where $n_i$ is the number of spins at location $r_i$:

$$\Sigma_i M_{ij}*n_i = S_{exper}(t_j) \quad (1)$$

Tikhonov regularization may be used by the computer to reduce noise due to high magnetic gradients (see for example, Jeffrey A. Fessler, IEEE SIGNAL PROCESSING MAGAZINE, 81, 2010). The computer may use a conjugated gradient approach to solve equation (1), with a regularization parameter $\beta$ that can be tuned for reconstruction preferences. In equation (2) below, $M_{ij}$ is represented by M, M' is the Hermitian conjugate of M, n is a vector representation of $n_i$, and $S_{exper}$ is the vector representation of $S_{exper}(t_j)$.

$$M'Mn + \beta|\nabla n|^2 = M'S_{exper} \quad (2)$$

Figure 6:
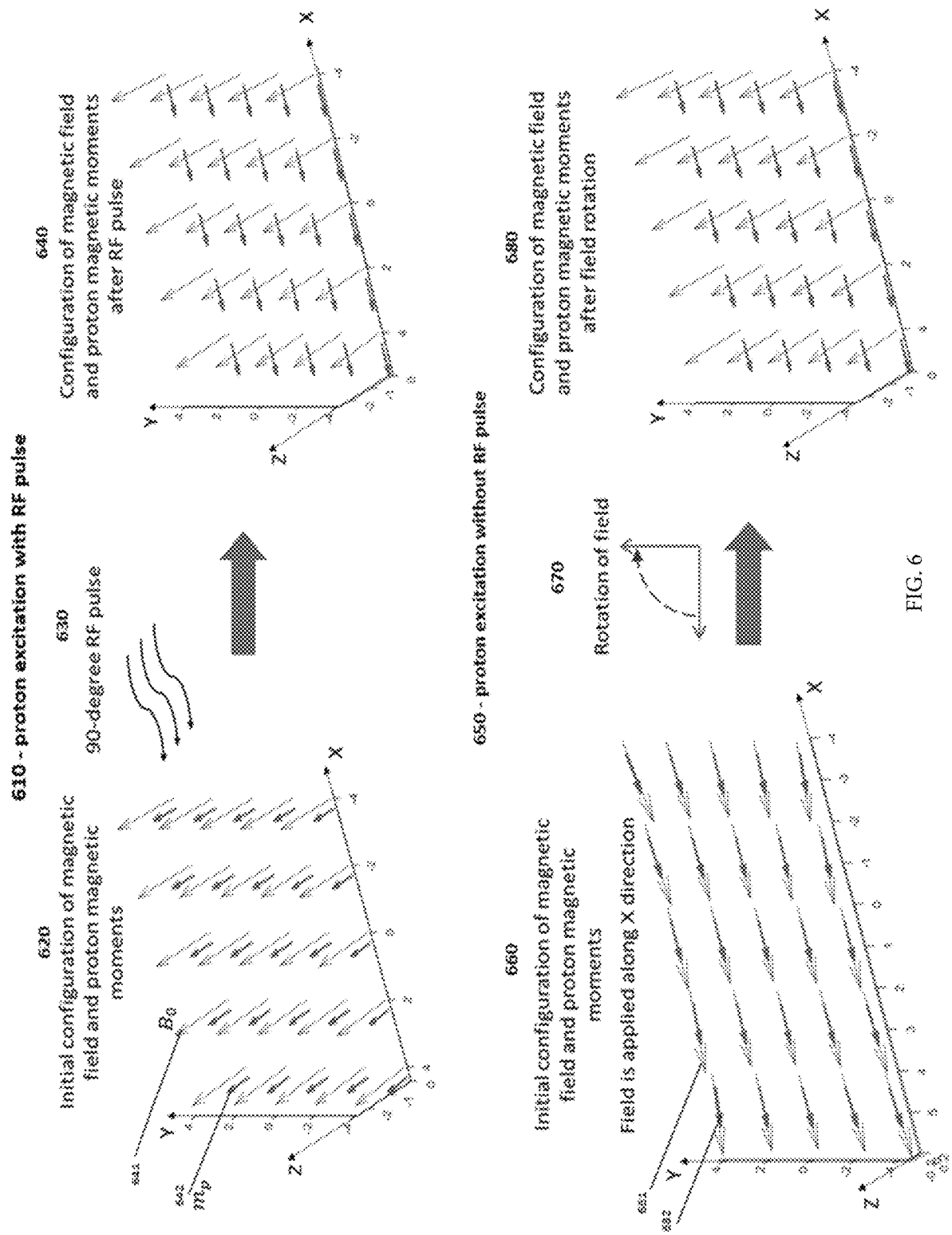
FIG. 6 illustrates a method of using the EPMMs to create an imbalance in the net spin magnetization within the object of interest, without using RF excitation according to the disclosed embodiments.

FIG. 6 illustrates a method of using the EPMMs to create an imbalance in the net spin magnetization within the object of interest, without using RF excitation. The top panel of FIG. 6 610 illustrates the conventional MRI method, in which an initial configuration 620 of spins that are initially aligned in the z-direction by the static field are converted by application of RF energy 630 to an excited state, where the net magnetization is in the x-direction 640. In the illustration, the static magnetic field B0 is denoted 641, and the net magnetization for a representative location in the object of interest is denoted 642. The lower panel 650 illustrates the use of the EPMM array to achieve a similar excited state by converting spins in the initial state 660 in which the spins are initially aligned in the x-direction by using an EPMM configuration that has a magnetic component in the x-direction, through the selective magnetization of EPMMs that change the direction of the applied magnetic field 670 thereby creating a magnetic field in a different direction, for example in the z-direction to achieve an excited state 680. The magnetic field applied to the spins is denoted 681 and the spins 682 are also illustrated.

Another advantage of the disclosed EPMM array is the ability to form a magnetic resonance image without the need to apply RF radiation with a transmission coil. This advantage is helpful because RF circuitry adds expense to the construction costs of devices, and the use of RF transmission can potentially cause heating in subjects.

Many MRI systems employ "gradient-recalled echo" (also known as "gradient echo") pulse sequences, in addition to the spin echo sequences. In regular gradient echo MRI pulse sequences, at least two fields $B_{EFF1}$ and $B_{EFF2}$ are needed to create an echo: static field $B_0$ and gradient field $G(r)$, where r is the position in space:

$$B_{EFF1}=B_0+G(r), B_{EFF2}=B_0-G(r), \quad (3)$$

The sequential applications of $B_{EFF1}$ and $B_{EFF2}$ compensate for the spin phases to cause an echo. During the first gradient the acquired phase difference is $$\Delta\varphi_{EFF1}=TE*G(r) \quad (4)$$

The phase different is compensated during the application of second gradient—G(r), $$\Delta\varphi_{EFF2}=-TE*G(r) \quad (5)$$

The final phase is $$\Delta\varphi_{Final}=\Delta\varphi_{EFF1}+\Delta\varphi_{EFF2}=0. \quad (5)$$

With the EPMMs, it is possible to completely invert the magnetic field, leading again to a final phase difference of 0.

$$B_{EFF1}=B_0+G(r), B_{EFF2}=-B_0-G(r), \quad (6)$$

$$\Delta\varphi_{EFF1}=TE*B_0+G(r), \Delta\varphi_{EFF2}=TE*[-B_0-G(r)] \quad (7)$$

$$\Delta\varphi_{Final}=\Delta\varphi_{EFF1}+\Delta\varphi_{EFF2}=0. \quad (8)$$

The utility of the equations (6)-(8) are illustrated by FIGS. 7-10, which include descriptions of pulse sequences that allow MRI without the need for transmission of RF energy and which also permit the use of gradient echoes even when the magnetic configurations are non-linear.

As described with reference to FIG. 6 above, the EPMM array can be used to apply an initial excitation of the spins. This method is in addition to the abilities described above to manipulate the spins as part of spin echo or gradient echo pulse sequences. In conventional MRI this excitation is performed by application of an RF pulse 630. After the RF pulse the excited state appears 640. In the disclosed method 650 in FIG. 6, instead of applying the RF pulse to rotating the spins from their initial equilibrium state, magnetic field 670 is rotated by changing the magnetization of some or all of the EPMMs. For example, as in 660, the magnetic field $B_0$ is oriented along x direction and all the spins are aligned with the field. After that the spins are exposed to a magnetic field in the z-direction, that has been rotated by 90 degrees 670 with respect to the initial state so that the spins are in the excited state 680. The EPMMs can be magnetized quickly (for example in tens of microseconds), which may be useful to maintain coherence of the spins in the excitation process.

Figure 7:
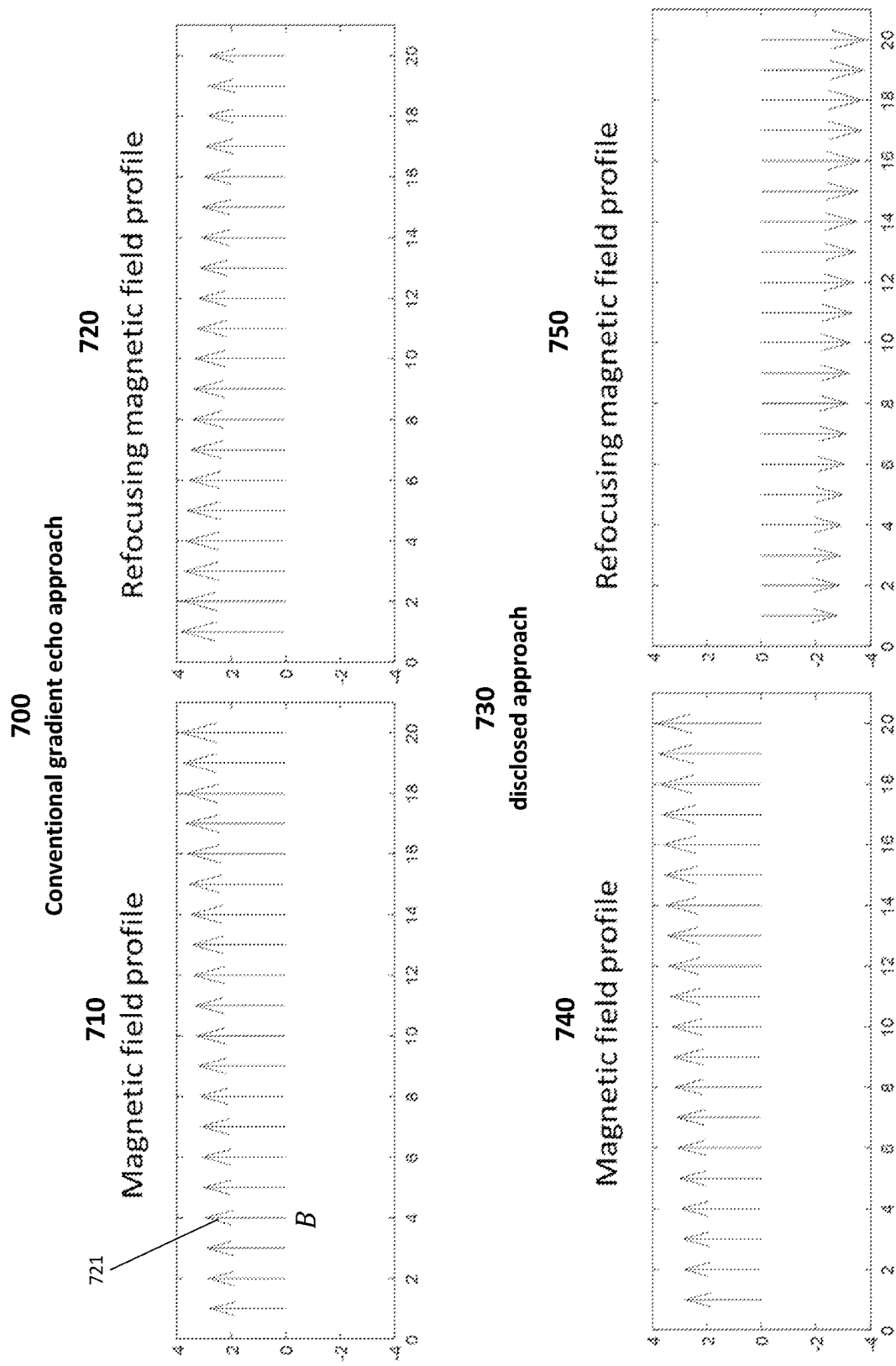
FIG. 7 shows a representative pair of magnetic configurations that can be used for echo formation according to conventional and disclosed embodiments.

FIG. 7 shows a representative pair of magnetic configurations that can be used for echo formation. Each panel in the figure represents a one-dimensional profile of the magnetic field in an object of interest. The upper row 700 represents the conventional MRI method. The magnetic field 721 experienced by an object in the region of interest includes a static component and an encoding linear magnetic gradient 710. When this field is applied, the proton spins acquire relative phase shifts leading to the signal decay. Further describing a conventional MRI approach, to compensate for those phase shifts the second magnetic field 720 is applied. The gradient has the same average value, but the linear component in the x-direction changes sign. So, instead of growing along x 710, the field reduces along x 720. This is described, for example, by the equation (3). Such an inversion allows the MRI to compensate the phase shifts obtained during the first encoding gradient. The bottom row 730 represents the disclosed method. In the disclosed method, at the beginning one also applies an encoding gradient 740, similar to the conventional method. The method diverges from the conventional method in that instead of changing the field gradient, the sign of the field 750 is changed (following equation (6)).

Figure 8:
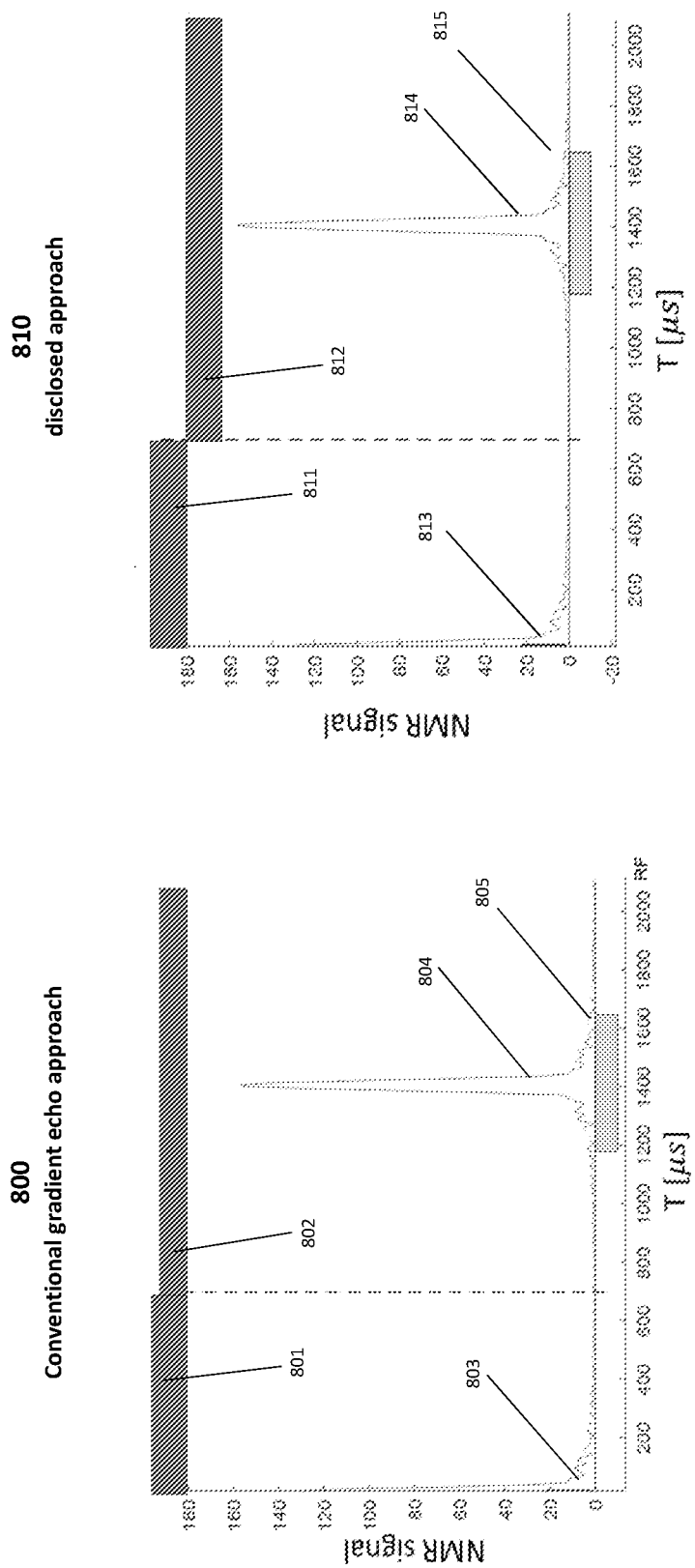
FIG. 8 further illustrates a method in which conventional and disclosed embodiments form an echo.

FIG. 8 further illustrates the method in which the system forms an echo: In a conventional MRI gradient pulse sequence 800, a magnetic field 801 applied to an object in the field of view causes dephasing of the spins and is followed by a second, (refocusing, magnetic field 802. The second magnetic field 802 includes a different gradient as in FIG. 7 (720). The FID of the signal 803, the echo 804 and the acquisition time 805 are illustrated.

In the disclosed method 810, the first magnetic field 811 is similar to magnetic field 801 in that it dephases the spins leading to FID (813), but the next magnetic field 812 is the reverse (see 750 in FIG. 7) of the first applied field (811). An echo 814 reforms in the acquisition window 815. The FID 813 and acquisition window 815 are the same.

Figure 9:
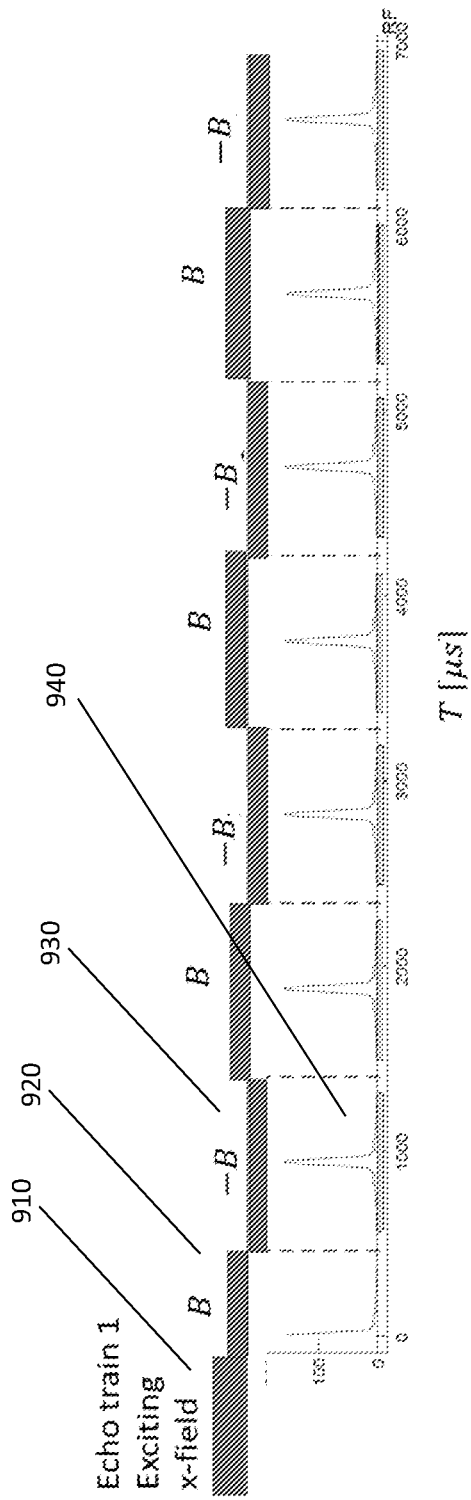
FIG. 9 illustrates an example of an imaging pulse sequence that employs the disclosed methods.

FIG. 9 illustrates an example of an imaging pulse sequence that employs the disclosed method of FIG. 8. The example sequence starts with application of magnetic field along one direction, for example, the x-direction as in 660, for a period of time, for example, close to the T1 time of the material in the object of interest, to create a net magnetization in that direction 910. Then the first encoding configuration B is applied 920, which may be in a direction perpendicular to the initial x-direction for example in the z-direction as in 680. After a TE/2 time, the refocusing field −B 930 is applied for a time TE. The refocusing field 930 is the negative of the first configuration 920, as for example is shown in FIG. 7, where 750 is the negative of 740. During this second configuration 930 an NMR signal 940 is acquired. The pair of opposite fields 920 and 930 may be applied multiple times to perform averaging and reduce noise, and their amplitudes and durations and configurations may be varied in the course of a pulse sequence to collect sufficient information to reconstruct an image.

Figure 10:
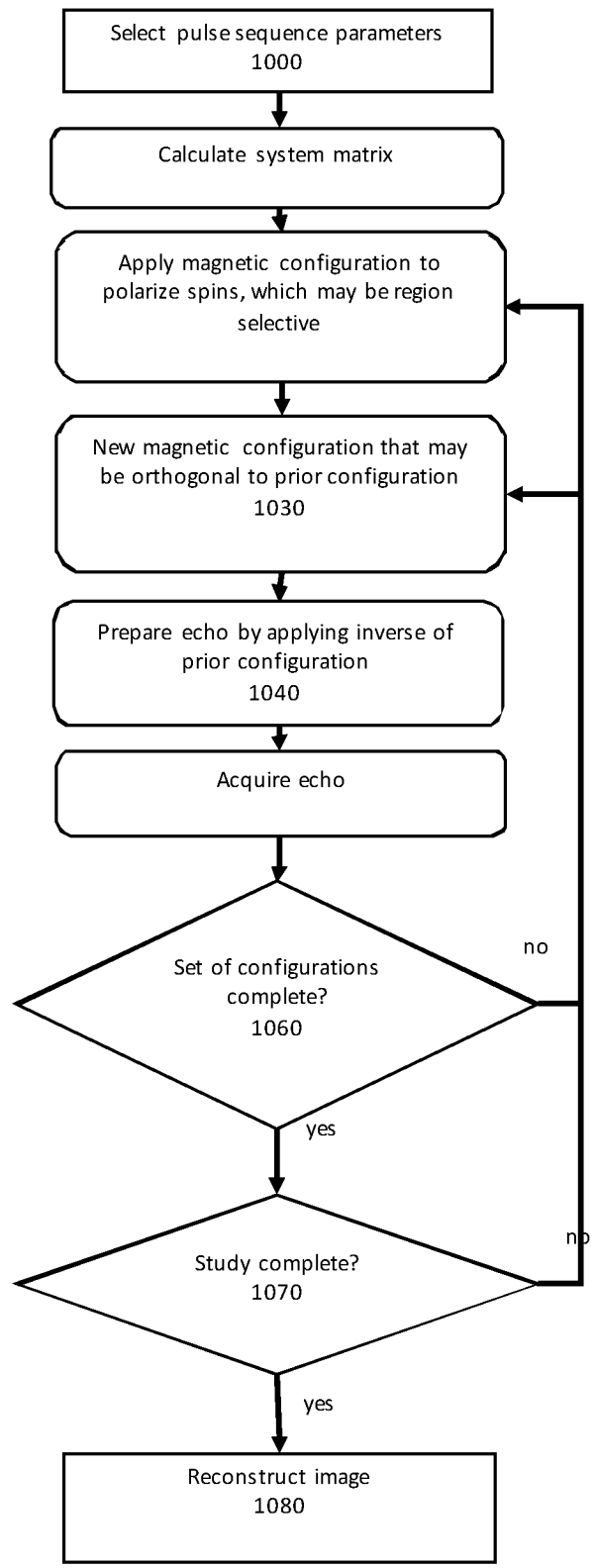
FIG. 10 shows a flow chart of the method described with respect to FIG. 9.

FIG. 10 illustrates the method described in FIG. 9. In step 1000, a computer determines the configurations and timings according to the specifications input by a user. A system matrix is calculated by the computer 1010. One or more magnetic configurations are applied by the EPMM array to create a net magnetization of spins in the object of interest 1020, for example as in 650. The magnetic configuration(s) created by the EPMM may be set so as to excite one or more specific regions in the object of interest, similar to the role of RF energy in selecting a slice in FIG. 4. A new magnetic configuration may be applied 1030, which may be orthogonal in direction to the prior direction of net magnetization, as in 680. A new magnetic configuration may be applied, which may be the inverse of the prior magnetic configuration 1040, so as to refocus an echo, as in 810. The echo may be acquired for processing by a computer 1050. A decision is made as to whether additional magnetic configurations are desired to collect more information about the object 1060. This decision step may be made in real-time as in FIG. 10 or may represent decisions made in advance of the other steps (1010-1050) by the computer when planning the sequence (for example, in step 1000). The computer decides that the sequence is complete 1070 and prepares the acquisition data for reconstruction 1080. It is understood that some of the acquisition data may be reconstructed prior to collection of the full data set, as might be useful to a user.

In general, MRI signals are acquired during so-called "echoes". An echo appears when all the spins in an object of interest are in phase. To induce an echo, one can use two methods. One is based on application of special sequence of radiofrequency (RF) pulses. In this case people use the term "spin echo". The other method is based on creating of special sequence of magnetic field gradients. In this case the term "gradient echo" is used. The disclosed embodiments illustrate a variation of both the "spin echo" and "gradient echo" sequence which can be realized in the MRI made with electro-permanent modules (EPMMs).

It is understood that the apparatus and methods provided in this invention for MRI will also apply to products that employ an MRI function along with other functionalities. For example, the EPMMs may create magnetic fields to move magnetic particles and may alternate from this motive function to an imaging function (that uses the MRI aspects of the invention). In another embodiment, the EPMMs may be used to deliver electromagnetic energy for neuronal stimulation, followed or preceded by MRIs of the region that is to be stimulated.

Although FIGS. 4 and 10 describe echo refocusing though RF transmission and configuration-reversal methods, respectively, it is understood that a pulse sequence may be made with both of these methods.

Electropermanent magnet modules (EPMMs) contain magnetizable materials whose magnetic state can be permanently changed by passing electrical currents through coils in the EPMM. MRI using EPMMs was disclosed by I. N. Weinberg "METHOD AND APPARATUS FOR MANIPULATING ELECTROPERMANENT MAGNETS FOR MAGNETIC RESONANCE IMAGING AND IMAGE GUIDED THERAPY" (US2017/0227617), in which the time-dependent gradients are created by the EPMMs and no static field is necessary, which is incorporated by reference in its entirety. The present disclosure describes a method of reconstructing images from data collected with these and other MRI systems.

Those skilled in the art will recognize, upon consideration of the above teachings, that the above exemplary embodiments and the control system may be based upon use of one or more programmed processors programmed with a suitable computer program. However, the disclosed embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

Moreover, it should be understood that control and cooperation of the above-described components may be provided using software instructions that may be stored in a tangible, non-transitory storage device such as a non-transitory computer readable storage device storing instructions which, when executed on one or more programmed processors, carry out he above-described method operations and resulting functionality. In this case, the term "non-transitory" is intended to preclude transmitted signals and propagating waves, but not storage devices that are erasable or dependent upon power sources to retain information.

Those skilled in the art will appreciate, upon consideration of the above teachings, that the program operations and processes and associated data used to implement certain of the embodiments described above can be implemented using disc storage as well as other forms of storage devices including, but not limited to non-transitory storage media (where non-transitory is intended only to preclude propagating signals and not signals which are transitory in that they are erased by removal of power or explicit acts of erasure) such as for example Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain embodiments. Such alternative storage devices should be considered equivalents.

While various exemplary embodiments have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed:

1. An apparatus for producing magnetic resonance images of an object of interest, the apparatus comprising:
   one or more arrays of electropermanent magnets in a vicinity of the object of interest,
   one or more sensors of electromagnetic radiation, and
   circuitry configured to supply power to, and to control, the one or more arrays and sensors to change magnetic configurations of the one or more arrays,
   wherein magnetic configurations are produced by the one or more electropermanent arrays, and wherein a computer changes the magnetic configurations during one or more spin echoes from a first magnetic field having a static field and a first encoding gradient to a second magnetic field which is a complete inversion of the first magnetic field, and
   wherein the computer implements net spin magnetization by changing the magnetic configurations during a spin echo using the one or more electropermanent magnet arrays in the vicinity of the object of interest.

2. The apparatus as in claim 1, where each electropermanent magnet of the one or more array is configured as an electropermanent magnetic module (EPMM), each EPMM containing the circuitry required to receive power to and to control the EPMM and to communicate with the computer outside the module.

3. The apparatus of claim 1, wherein the changed magnetic configurations include a magnetic configuration that is orthogonal to a prior magnetic configuration, and another magnetic configuration that is inverse to the orthogonal configuration.

4. The apparatus of claim 3, wherein the computer reconstructs the image from an acquired gradient echo based on the changed magnetic configurations.

5. The apparatus of claim 1, wherein the computer refocuses an echo produced by reversing of polarity of a magnetic configuration compared to a previous magnetic configuration applied to the region of interest.

6. The apparatus of claim 1, wherein the magnetic configurations produced are non-linear.

7. A method for producing magnetic resonance images comprising:
   providing one or more arrays of electropermanent magnets in a vicinity of an object of interest, one or more sensors of electromagnetic radiation, and circuitry configured to supply power to, and to control, the one or more arrays and sensors,
   producing and changing a magnetic configuration of the one or more arrays from a first magnetic field having a static field and a first encoding gradient to a second magnetic field which is a complete inversion of the first magnetic field to produce echoes, and
   reconstructing an image based on the echoes, and
   wherein a net spin magnetization is implemented by changing magnetic configurations during a spin echo using one or more electropermanent magnet arrays in the vicinity of the object of interest.

8. The method of claim 7, wherein one or more of magnetic configurations applied to the region of interest change during a spin echo.

9. The method of claim 7, further comprising refocusing one of the produced echoes by reversing the polarity of one or more magnetic configurations applied to the object of interest.

10. The method of claim 7, wherein a net spin magnetization is implemented by changing magnetic configurations using one or more electropermanent magnet arrays in the vicinity of the object of interest.

11. The method of claim 7, wherein the magnetic configurations are non-linear.

12. The method of claim 7, wherein each electropermanent magnet of the one or more array is configured as an electropermanent magnetic module (EPMM), each EPMM containing the circuitry required to receive power and to control the EPMM and to communicate with a computer outside the module.

* * * * *